United States Patent
Kuang et al.

(10) Patent No.: US 8,493,774 B2
(45) Date of Patent: Jul. 23, 2013

(54) PERFORMING LOGIC FUNCTIONS ON MORE THAN ONE MEMORY CELL WITHIN AN ARRAY OF MEMORY CELLS

(75) Inventors: Jente B. Kuang, Austin, TX (US); Rahul M. Rao, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 217 days.

(21) Appl. No.: 13/162,753

(22) Filed: Jun. 17, 2011

(65) Prior Publication Data

US 2012/0320689 A1 Dec. 20, 2012

(51) Int. Cl.
*G11C 11/00* (2006.01)

(52) U.S. Cl.
USPC ........................... 365/154; 326/121; 365/156

(58) Field of Classification Search
None
See application file for complete search history.

(56) References Cited

U.S. PATENT DOCUMENTS

| | | | |
|---|---|---|---|
| 4,995,001 A * | 2/1991 | Dawson et al. | 365/154 |
| 6,707,692 B2 | 3/2004 | Hata | |
| 7,061,783 B2 | 6/2006 | Shin et al. | |
| 7,499,312 B2 * | 3/2009 | Matick et al. | 365/154 |
| 2004/0156228 A1 * | 8/2004 | Becker | 365/154 |
| 2010/0110773 A1 | 5/2010 | Sachdev et al. | |
| 2010/0315859 A1 | 12/2010 | Lee | |

* cited by examiner

*Primary Examiner* — Alexander Sofocleous
(74) *Attorney, Agent, or Firm* — Francis Lammes; Stephen J. Walder, Jr.; Eustus D. Nelson

(57) ABSTRACT

A circuit structure is provided for performing a logic function within a memory. A plurality of read word line transistors are provided that receive a read word line signal and, upon receiving the read word line signal, the plurality of read word line transistors provide a path from a plurality of bit-line transistors associated with a plurality of physically adjacent memory cells to a read bit-line. In response to an associated memory cell within the memory storing a first value, each of the plurality of read bit-line transistors turns on and provides a path to ground thereby causing a first output value to be output on the read bit-line. In response to all of the plurality of memory cells storing a second value, the plurality of read bit-line transistors turn off thereby preventing a path to ground and a second output value is output on the read bit-line.

20 Claims, 11 Drawing Sheets

MEMORY CELL 200

MEMORY CELL 210

PERFORMING LOGIC FUNCTIONS ON MORE THAN ONE MEMORY CELL WITHIN AN ARRAY OF MEMORY CELLS

BACKGROUND

The present application relates generally to an improved data processing apparatus and method and more specifically to mechanisms for performing logic functions on more than one memory cell within an array of memory cells, Random access memory (RAM) most commonly refers to computer chips that temporarily store dynamic data to enhance computer performance. By storing frequently used or active files in random access memory, a computer may access the data faster than if the computer retrieves the data from a far-larger hard drive. Random access memory is volatile memory, meaning it loses its contents once power is cut. This is different from non-volatile memory such as hard disks and flash memory, which do not require a power source to retain data.

Random access memory, which may also be referred to as cache memory arrays, is comprised of a plurality of memory cells having an individual logic circuit associated with each memory cell. When logic 1:Unctions are to be performed based on the content of more than one memory location in the random access memory, current implementation achieve such logic functions in custom logic blocks outside the memory arrays,

SUMMARY

In one illustrative embodiment, a circuit structure is provided for performing a logic function within a memory. In the illustrative embodiment, a first transistor receives a read word line signal. Upon receiving the read word line signal, the first transistor provides a path from a second transistor to a read bit-line and a path from a third transistor to the read bit-line. In the illustrative embodiment, the second transistor, in response to a first memory cell within the memory storing a first value, turns on and provides a first path to ground thereby causing a first output value to be output on the read bit-line. In the illustrative embodiment, the third transistor, in response to a second memory cell physically adjacent to the first memory cell within the memory storing a second value, turns on and provides a second path to ground thereby causing a second output value to be output on the read bit-line. In the illustrative embodiment, in response to the first memory cell and the second memory cell each storing a third value, the second transistor and the third transistor both turn off thereby preventing a path to ground such that a third output value is output on the read bit-line.

In another embodiment, a second circuit structure is provided for performing a logic function within a memory. In the illustrative embodiment, a first transistor and a second transistor receive a read word line signal. Upon receiving the read word line signal, the first transistor provides a path from a third transistor to a read bit-line and a path from a fourth transistor to the read bit-line. Also, upon receiving the read word line signal, the second transistor provides a path from the third transistor to the read bit-line and a path from the fourth transistor to the read bit-line. In the illustrative embodiment, the third transistor, in response to a first memory cell within the memory storing a first value, turns on and provides a first path to ground thereby causing a first output value to be output on the read bit-line. In the illustrative embodiment, the fourth transistor, in response to a second memory cell physically adjacent to the first memory cell within the memory storing a second value, turns on and provides a second path to ground thereby causing a second output value to be output on the read bit-line. In the illustrative embodiment, in response to the first memory cell and the second memory cell each storing a third value, the third transistor and the fourth transistor both turn off thereby preventing a path to ground such that a third output value is output on the read bit-line.

In a further embodiment, a third circuit structure is provided for performing a logic function within a memory. In the illustrative embodiment, a plurality of read word line transistors receive a read word line signal. Upon receiving the read word line signal, the plurality of read word line transistors provide a path from a plurality of bit-line transistors associated with a plurality of memory cells to a read bit-line. In the illustrative embodiment, each of the plurality of read bit-line transistors that, in response to an associated memory cell within the memory storing a first value, turns on and provides a path to ground thereby causing a first output value to be output on the read bit-line. In the illustrative embodiment, the plurality of memory cells are physically adjacent to each other. In the illustrative embodiment, in response to all of the plurality of memory cells storing a second value, the plurality of read bit-line transistors turn off thereby preventing a path to ground such that a second output value is output on the read bit-line.

In still a further embodiment, a fourth circuit structure is provided for performing a logic function within a memory. In the illustrative embodiment, a first transistor receives a read word line signal. Upon receiving the read word line signal, the first transistor provides a path from a second transistor to ground and a path from a third transistor to ground. In the illustrative embodiment, the second transistor, in response to a first memory cell within the memory storing a first value, turns on thereby causing a first output value to be output on the read bit-line. In the illustrative embodiment, the third transistor, in response to a second memory cell physically adjacent to the first memory cell within the memory storing a second value, turns on thereby causing a second output value to be output on the read bit-line. In the illustrative embodiment, in response to the first memory cell and the second memory cell each storing a third value, the second transistor and the third transistor both turn off thereby preventing a path to ground such that a third output value is output on the read bit-line.

These and other features and advantages of the present invention will be described in, or will become apparent to those of ordinary skill in the art in view of, the following detailed description of the example embodiments of the present invention.

BRIEF DESCRIPTION OF THE SEVERAL VIEWS OF THE DRAWINGS

The invention, as well as a preferred mode of use and further objectives and advantages thereof, will best be understood by reference to the following detailed description of illustrative embodiments when read in conjunction with the accompanying drawings, wherein.

DETAILED DESCRIPTION

The illustrative embodiments provide a mechanism for performing logic functions on more than one memory cell within an array of memory cells, such as a SRAM based cache memory. By performing logic functions within the memory as opposed to outside the memory, less peripheral circuitry may be required as the logic functions are built into the memory, chip complexity may be reduced due to the reduction in required peripherals, and power required by the chip may be reduced by overall optimization. That is, by performing logic functions directly within the memory, the logic functions operate faster than high-speed cache access memories and a memory with logic functions built in may be more compatible with diverse logic functioning systems.

Figure 1:
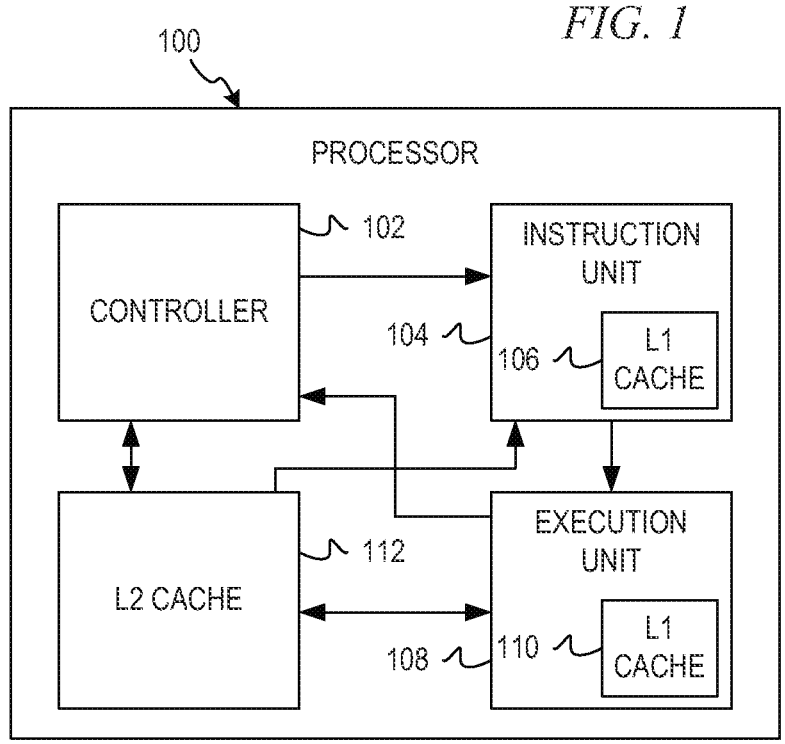
FIG. 1 depicts one example of a data processing environment in which a cache memory array may be utilized.

FIG. 1 is provided as one example of a data processing environment in which a cache memory array may be utilized, i.e. in a cache of a processor. FIG. 1 is only offered as an example data processing environment in which the aspects of the illustrative embodiments may be implemented and is not intended to state or imply any limitation with regard to the types of, or configurations of, data processing environments in which the illustrative embodiments may be used. To the contrary, any environment in which a cache memory array may be utilized is intended to be within the spirit and scope of the present invention.

FIG. 1 is an exemplary block diagram of processor 100 in accordance with an illustrative embodiment. Processor 100 includes controller 102, which controls the flow of instructions and data into and out of processor 100. Controller 102 sends control signals to instruction unit 104, which includes L1 cache 106. Instruction unit 104 issues instructions to execution unit 108, which also includes L1 cache 110. Execution unit 108 executes the instructions and holds or forwards any resulting data results to, for example, L2 cache 112 or controller 102. In turn, execution unit 108 retrieves data from L2 cache 112 as appropriate. Instruction unit 104 also retrieves instructions from L2 cache 112 when necessary. Controller 102 sends control signals to control storage or retrieval of data from L2 cache 112. Processor 100 may contain additional components not shown, and is merely provided as a basic representation of a processor and does not limit the scope of the present invention. Although, FIG. 1 depicts only level 1 (L1) cache and Level 2 (L2) cache, the illustrative embodiments are not limited to only these levels of memory hierarchy. That is, the illustrative embodiments may be applied to any level of memory hierarchy without departing from the spirit and scope of the invention.

Those of ordinary skill in the art will appreciate that the hardware in FIG. 1 may vary depending on the implementation. Other internal hardware or peripheral devices, such as flash memory, equivalent non-volatile memory, or optical disk drives and the like, may be used in addition to or in place of the hardware depicted in FIG. 1. Also, the processes of the illustrative embodiments may be applied to a multiprocessor data processing system, without departing from the spirit and scope of the present invention.

Figure 2:
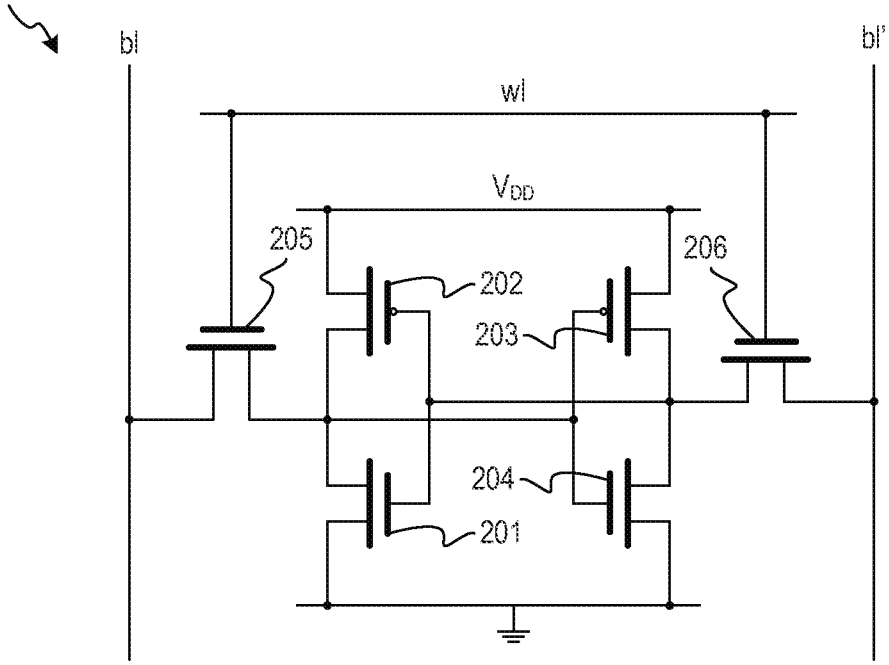
FIG. 2 depicts an example of a conventional 6 transistor (6T) memory cell in accordance with an illustrative embodiment.
Figure 2:
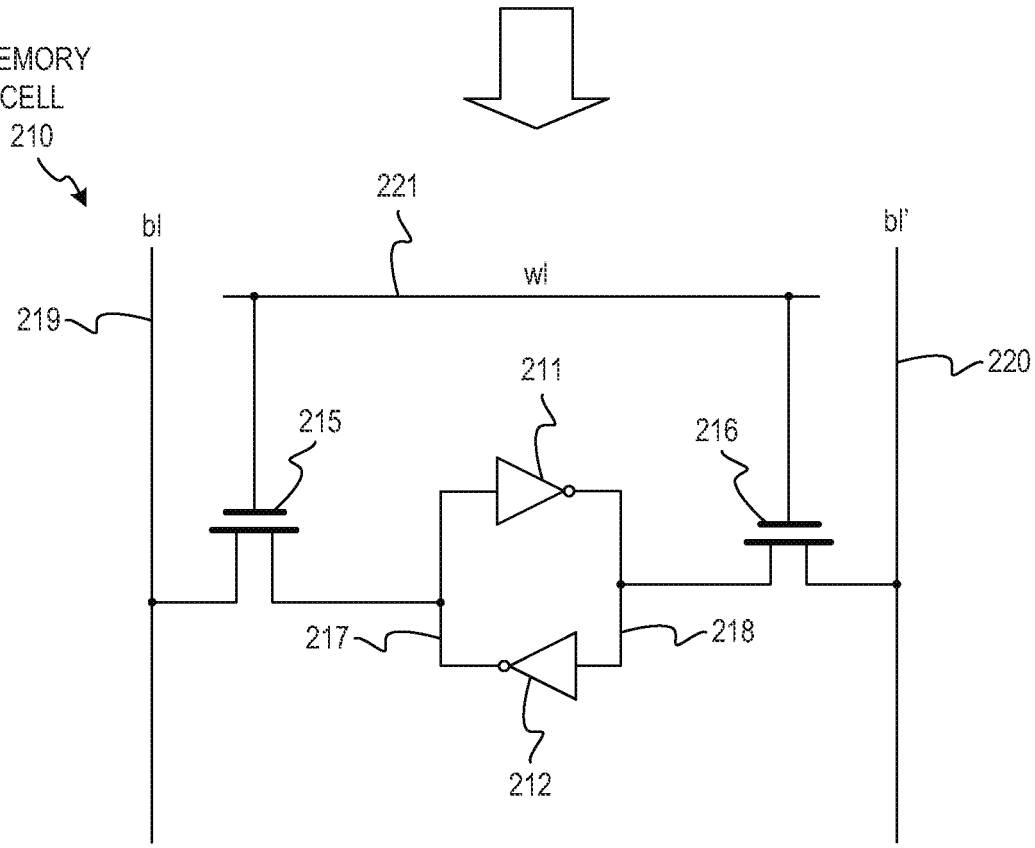

Moreover, the data processing system 100 may take the form of any of a number of different data processing systems including client computing devices, server computing devices, a tablet computer, laptop computer, telephone or other communication device, a personal digital assistant (PDA), or the like. In some illustrative examples, data processing system 100 may be a portable computing device which is configured with flash memory to provide non-volatile memory for storing operating system files and/or user-generated data, for example. Essentially, data processing system 100 may be any known or later developed data processing system without architectural limitation, FIG. 2 depicts an example of a conventional 6 transistor (6T) memory cell in accordance with an illustrative embodiment. Memory cell 200 forms the basis for most static random-access memories in complementary metal oxide semiconductor (CMOS) technology. Memory cell 200 uses six transistors 201-206 to store and access one bit. Transistors 201-204 in the center form two cross-coupled inverters, which is illustrated in the more simplified memory cell 210 comprising inverters 211 and 212. Due to the feedback structure created by inverters 211 and 212, a low input value on inverter 211 will generate a high value on inverter 212, which amplifies (and stores) the low value on inverter 212. Similarly, a high input value on inverter 211 will generate a low input value on inverter 212, which feeds back the low input value onto inverter 211. Therefore, inverters 211 and 212 will store their current logical value, whatever value that is.

Lines 217 and 218 between inverters 211 and 212 are coupled to separate bit-lines 219 and 220 via two n-channel pass-transistors 215 and 216. The gates of transistors 215 and 216 are driven by word line 221. In a memory array, word line 221 is used to address and enable all bits of one memory word. As long as word line 221 is kept low, memory cell 210 is decoupled from bit-lines 219 and 220. Inverters 211 and 212 keep feeding themselves and memory cell 210 stores its current value.

When word line 221 is high, both transistors 215 and 216 are conducting and connect the inputs and outputs of inverters 211 and 212 to bit-lines 219 and 220. That is, inverters 211 and 212 drive the current data value stored inside the memory cell 210 onto bit-line 219 and the inverted data value onto inverted bit-line 220. To write new data into memory cell 210, word line 221 is activated and, depending on the current value stored inside memory cell 210, there might be a short-circuit condition and the value inside memory cell 210 is literally overwritten. This only works because transistors 201-204 that make up inverters 211 and 212 are very weak. That is, transistors 201-204 are considered weak because when new data is to be written to transistors 201-204, the current state of transistors 201-204 may be easily overridden with the new state.

Figure 3:
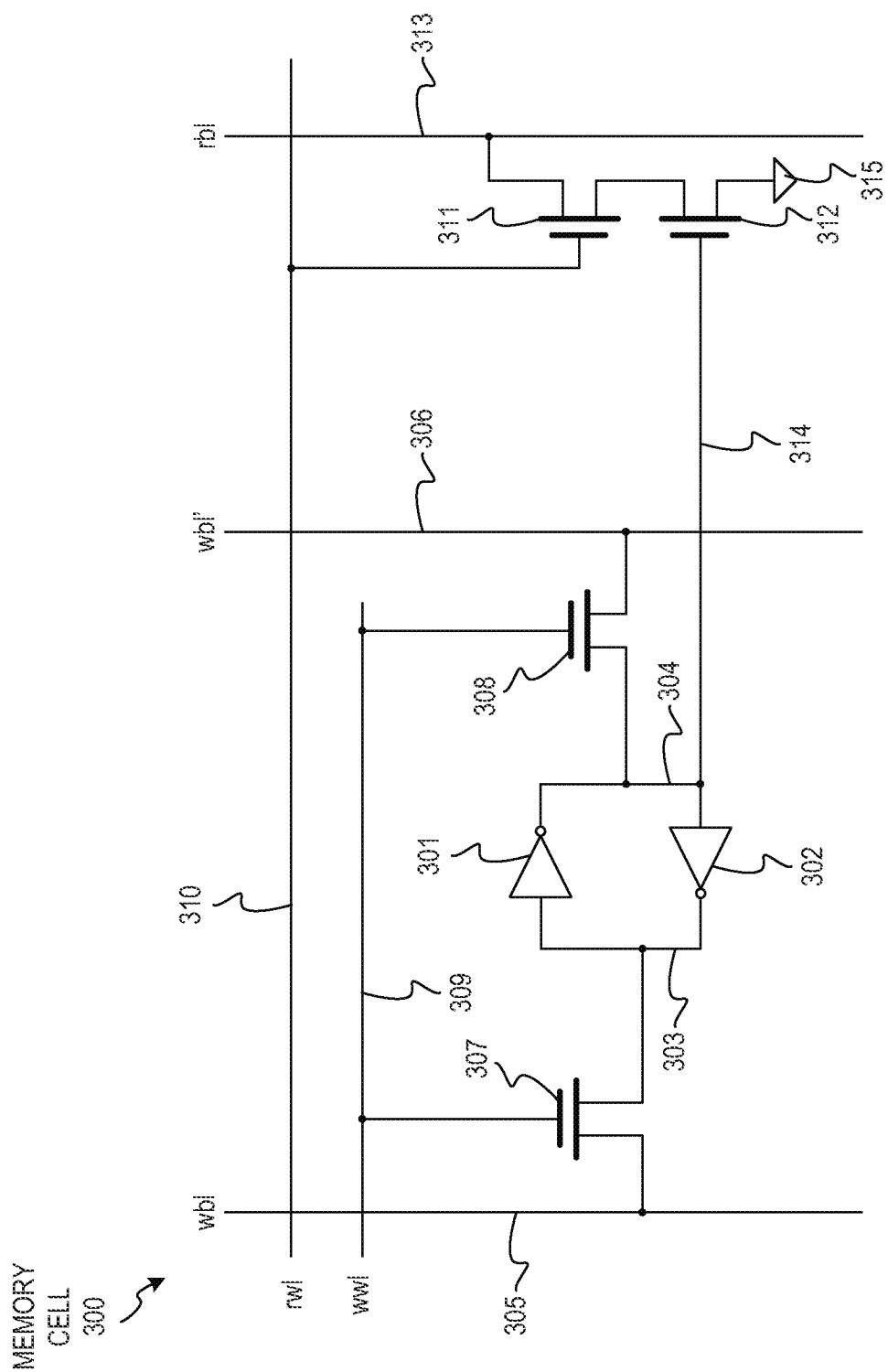
FIG. 3 depicts an example of a conventional 8 transistor (8T) memory cell in accordance with an illustrative embodiment.

The majority of the power dissipated in cache memory arrays comes from the pre-charging and discharging of bit-lines during a read access. The bit-lines, such as bit-lines 219 and 220 in FIG. 2, span the entire height of the cache memory array and tend to be highly capacitive and thus introduce stability issues into each memory cell. Thus, to lower power consumption and improve stability of a 6T memory cell, such as memory cell 210, an improved memory cell is provided in an 8T memory FIG. 3 depicts an example of a conventional 8 transistor (8T) memory cell in accordance with an illustrative embodiment. Memory cell 300 uses eight transistors to store and access one bit. Four of the transistors form two cross-coupled inverters 301 and 302, as is illustrated in FIG. 2. Due to the feedback structure created by inverters 301 and 302, a low input value on inverter 301 will generate a high value on inverter 302, which amplifies (and stores) the low value on inverter 302. Similarly, a high input value on inverter 301 will generate a low input value on inverter 302, which feeds back the low input value onto inverter 301. Therefore, inverters 301 and 302 will store their current logical value, whatever value that is.

Lines 303 and 304 between inverters 301 and 302 are coupled to write bit-line 305 and inverted write bit-line 306 via two n-channel pass-transistors 307 and 308. The gates of transistors 307 and 308 are driven by write word line 309. In a memory array, write word line 309 is used to address and enable all bits of one memory word. As long as write word line 309 is kept tow, memory cell 300 is decoupled from write bit-line 305 and inverted write bit-line 306. Inverters 301 and 302 keep feeding themselves and memory cell 300 stores its current value.

When write word line 309 is high, both transistors 307 and 308 are conducting and connect the inputs and outputs of inverters 301 and 302 to write bit-line 305 and inverted write bit-line 306. That is, inverters 301 and 302 drive the current data value stored inside the memory cell 300 onto bit-line 305 and the inverted data value onto inverted bit-line 306. To write new data into memory cell 300, write word line 309 is activated and, depending on the current value stored inside memory cell 300, there might be a short-circuit condition and the value inside memory cell 300 is literally overwritten. This only works because the transistors that make up inverters 301 and 302 are very weak. That is, the transistors are considered weak because when new data is to be written to the transistors, the current state of the transistors may be easily overridden with the new state.

During a read of memory cell 300, read word line 310 is high, which drives the gate of transistor 311 to pass the value from transistor 312 onto read bit-line 313. The value of transistor 312 is controlled by the value stored by inverters 301 and 302. That is, if the value stored by inverters 301 and 302 is a then the gate of transistor 312will be high through connection 314, which will cause a discharge to ground 315 and a 0 will be passed onto read bit-line 313. Conversely, if the value stored by inverters 301 and 302 is a 0, then the gate of transistor 312 will be low through connection 314, which will cause a 1 will be passed onto read bit-line 313.

As stated previously, in known systems, when the values two memory cells, such as either memory cell 200 of FIG. 2 or memory cell 300 of FIG. 3, are to have a logic function performed on the two memory cells, then the logic function is performed outside of the memory where the read bit lines of each of the memory cells is read and then compared through an logic gate such as an OR gate, an AND gate, a NOR gate, a NAND gate, or the like. However, in order to perform such logic functions with less exterior peripherals, reduced chip complexity, and overall improved power performance; the illustrative embodiments provide a mechanism for performing such logic functions directly within the memory.

Figure 4:
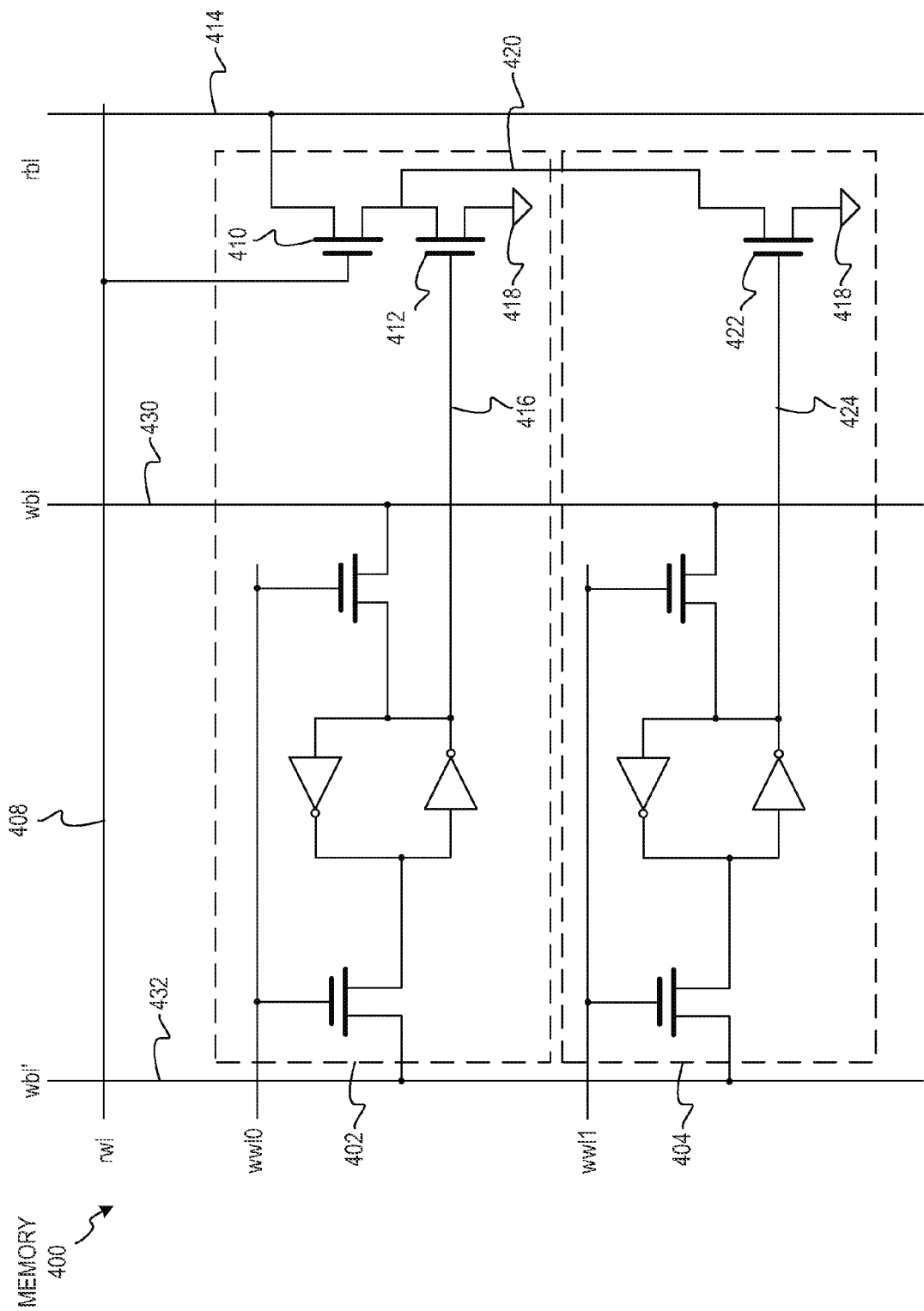
FIG. 4 depicts an example of a memory comprising two physically adjacent memory cells with different addresses in which a logic function is implemented in accordance with an illustrative embodiment.

FIG. 4 depicts an example of a memory comprising two physically adjacent memory cells with different addresses in which a logic function is implemented in accordance with an illustrative embodiment. Memory cells 402 and 404 are memory cells similar to memory cell 300 of FIG. 3. In that memory cells 402 and 404 each have four transistors that form two cross-coupled inverters and that the inverters are coupled to write bit-line 430 and an inverted write bit-line 432 via two n-channel pass-transistors, which operate as described previously in FIG. 3. Note that FIG. 4 differs from FIG. 3 in that write bit-line 430 and an inverted write bit-line 432 are on opposite sides and memory cell 404 comprises only seven transistors.

In accordance with this illustrative embodiment, values stored in the inverters of memory cells may be subject to logic functions, such as ORing, ANDing, NORing, NANDing, or the like. In this illustration, an OR logic function is performed between memory cell 402 and memory cell 404. A read of memory cells 402 and 404 would cause read word line 408 to be high, which drives the gate of transistor 410 to pass the value from transistor 412 onto read bit-line 414. The value of transistor 412 is controlled by the value stored in memory cell 402. That is, if the value stored in memory cell 402 is a 1, then the gate of transistor 412 will be high through connection 416, which will cause a discharge to ground 418 and a 0 will be passed onto read bit-line 414.

If the value stored in memory cell 402 is a 0, then the gate of transistor 412 will be low through connection 416, which would normally cause read bit-line 414 to remain in its pre-charged [or logic 1] state. However, by the use of connection 420, if the value stored in memory cell 404 is a 1, then the gate of transistor 422 will be high through connection 424, which will cause a discharge to ground 418 and a 0 will be passed onto read bit-line 414, regardless of whether memory cell 402 is storing a 0. Therefore, with regard to the logic function performed by the illustrative embodiments, if memory cell 402 "or" memory cell 404 is storing a 1, then read bit-line 414 would discharge and a 0 would be readout of memory 400. That is, typically, the bit-line will feed into a global bit-line read circuitry, which will invert this information, so that the actual content read out of a memory will be 1 when either cell 402 or cell 404 are storing a 1.

Figure 5:
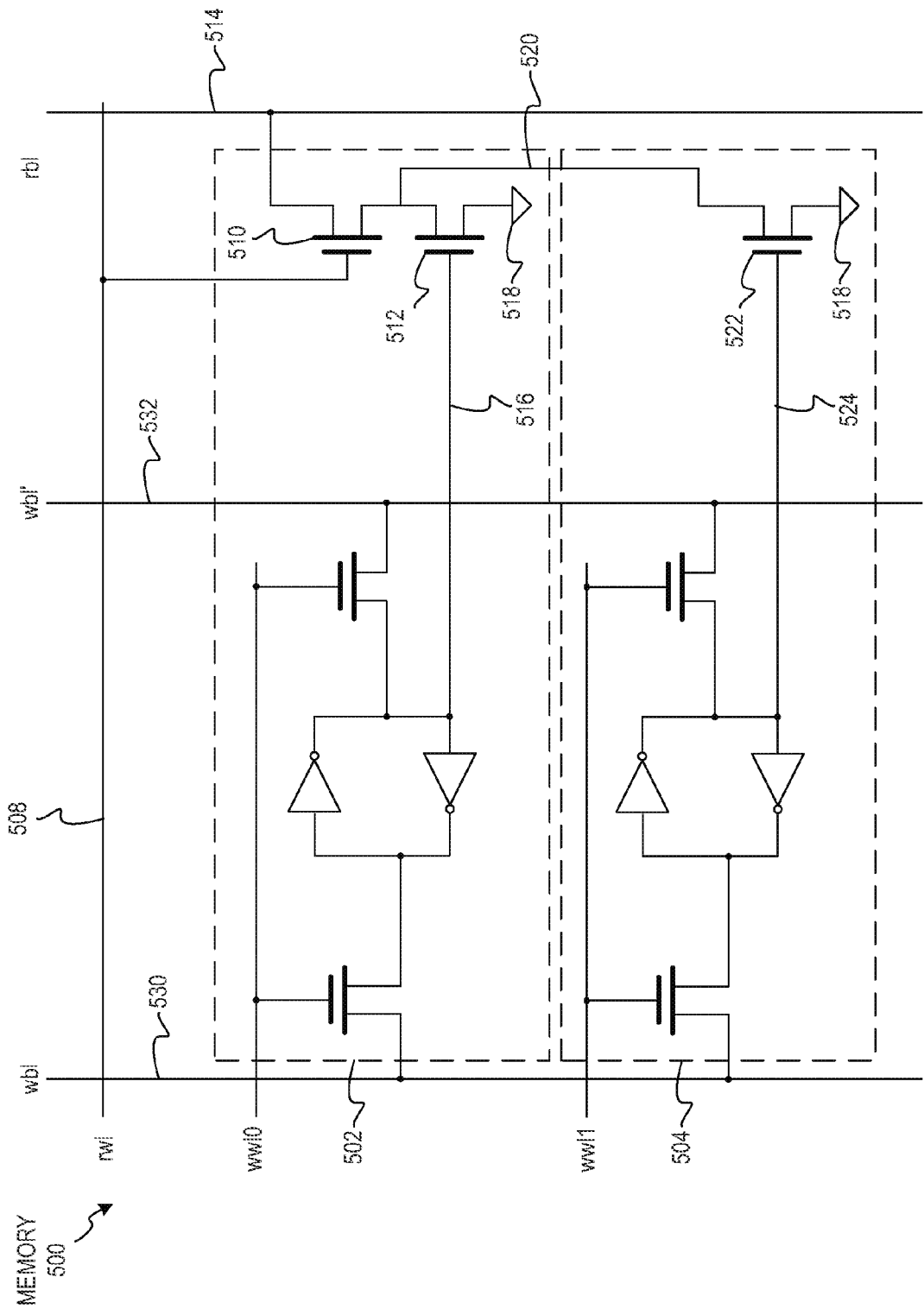
FIG. 5 depicts another example of a memory comprising two physically adjacent memory cells with different addresses in which a logic function is implemented in accordance with an illustrative embodiment.

FIG. 5 depicts another example of a memory comprising two physically adjacent memory cells with different addresses in which a different logic function, namely an AND function, is implemented in accordance with an illustrative embodiment. FIG. 5 differs from FIG. 4 in that FIG. 5 depicts an implementation of an AND function as opposed to the OR function implemented in FIG. 4. Memory cells 502 and 504 are memory cells similar to memory cell 300 of FIG. 3. In that memory cells 502 and 504 each have four transistors that form two cross-coupled inverters and that the inverters are coupled to write bit-line 530 and an inverted write bit-line 532 via two n-channel pass-transistors, which operate as described previously in FIG. 3. Note that FIG. 5 differs from FIG. 4 in that the ordering of the bit lines is opposite of that in FIG. 4. This implies that the true value, write bit-line 530, is on the left side of memory cells 502 and 504 and the complementary value, inverted write bit-line 532, is on the right side of memory cells 502 and 504.

In accordance with this illustrative embodiment, values stored in the inverters of memory cells may be subject to logic functions, such as ORing, ANDing, NORing, NANDing, or the like. For example, if an AND logic function is to be performed between memory cell 502 and memory cell 504, then a read of memory cells 502 and 504 would cause read word line 508 to be high, which drives the gate of transistor 510. The gate of transistor 512 is controlled by the complementary value of the cell stored in memory cell 502. That is, if the complementary value of the memory cell 502 is a 1, then the gate of transistor 512 will be high through connection 516, which will cause a discharge to ground 518 and a 0 will be passed onto read bit-line 514.

If the complementary value stored in memory cell 502 is a 0, then the gate of transistor 512 will be low through connection 516, which would normally cause read bit-line 514 to remain in its pre-charged [or logic 1] state. However, by the use of connection 520, if the complementary value stored in memory cell 504 is a 1, then the gate of transistor 522 will be high through connection 524, which will cause a discharge to ground 518 and a 0 will be passed onto read bit-line 514, regardless of whether memory cell 502 is storing a 0. Therefore, with regard to the logic function performed by the illustrative embodiments, if the memory cell 502 "and" the memory cell 504 are both storing a 1, then read bit-line 514 would not discharge and a 1 would be readout of memory 500.

Figure 6:
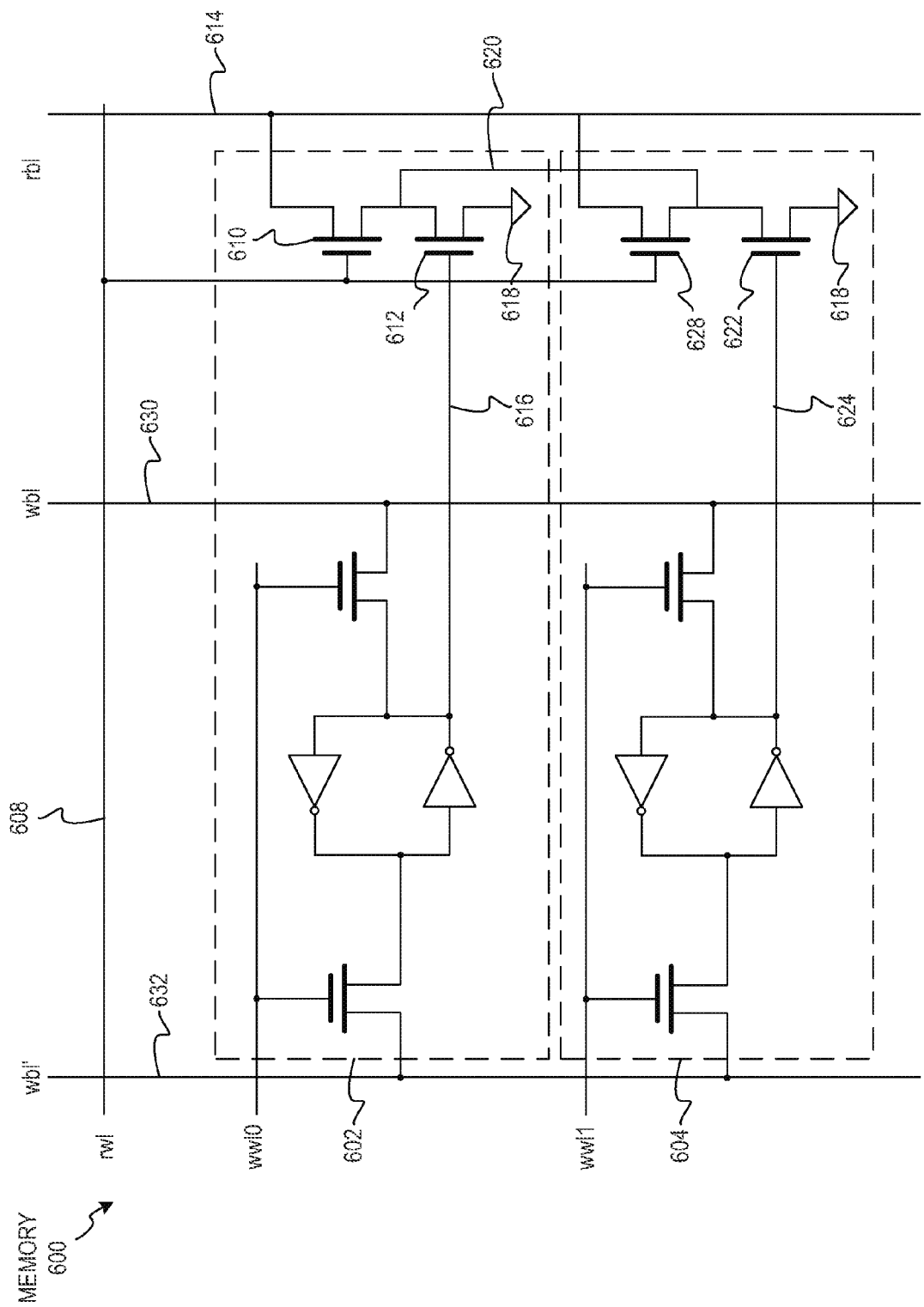
FIG. 6 depicts yet another example of a memory comprising two physically adjacent memory cells with different addresses in which a logic function is implemented in accordance with an illustrative embodiment.

FIG. 6 depicts yet another example of a memory comprising two physically adjacent memory cells with different addresses in which a logic function is implemented in accordance with an illustrative embodiment. Memory cells 602 and 604 are memory cells similar to memory cell 300 of FIG. 3. In that memory cells 602 and 604 each have four transistors that form two cross-coupled inverters and that the inverters are coupled to write bit-line 630 and an inverted write bit-line 632 via two n-channel pass-transistors, which operate as described previously in FIG. 3. Note that FIG. 6 differs from FIG. 3 in that write bit-line 630 and an inverted write bit-line 632 are on opposite sides.

In accordance with this illustrative embodiment, values stored in the inverters of memory cells may be subject to logic functions, such as ORing, ANDing, NORing, NANDing, or the like. For example, if an OR logic function is to be performed between memory cell 602 and memory cell 604, then a read of memory cells 602 and 604 would cause read word line 608 to be high, which would drive the gate of transistor 610 to pass the value from transistor 612 onto read bit-line 614 as well as drive the gate of transistor 628 to pass the value from transistor 622 onto read bit-line 614.

However, if the value stored in memory cell 602 is a 1 or if the value stored in memory cell 604 is a 1, then the gate of transistor 612 will be high through connection 616, which will cause a discharge to ground 618 and a 0 will be passed onto read bit-line 614, or the gate of transistor 622 will be high through connection 624, which will cause a discharge to ground 618 and a 0 will be passed onto read bit-line 614 all because of connection 620. Therefore, with regard to the logic function performed by the illustrative embodiments, if memory cell 602 "or" memory cell 604 is storing a 1, then read bit-line 614 would discharge and a 0 would be readout of memory 600. In order for a 1 to be passed onto read bit-line 614, both the value stored in memory cell 602 and the value stored in memory cell 604 would both have to be 0.

The benefit of using the configuration illustrated in FIG. 6 is that all front-end of line (FEOL) features are identical to the conventional 8T memory cell. Therefore, no additional front-end device qualification would be required as conventional 8T memory cells could be used with only minor back-end of line modification. As is previously illustrated between FIG. 5 and FIG. 4, an AND logic function can be easily implemented by having connections 616 and 624 originate from inverted write bit-line 632 rather than write bit-line 630 or, alternatively, writing the inverse values to memory cell 602 and memory cell 604.

Figure 7:
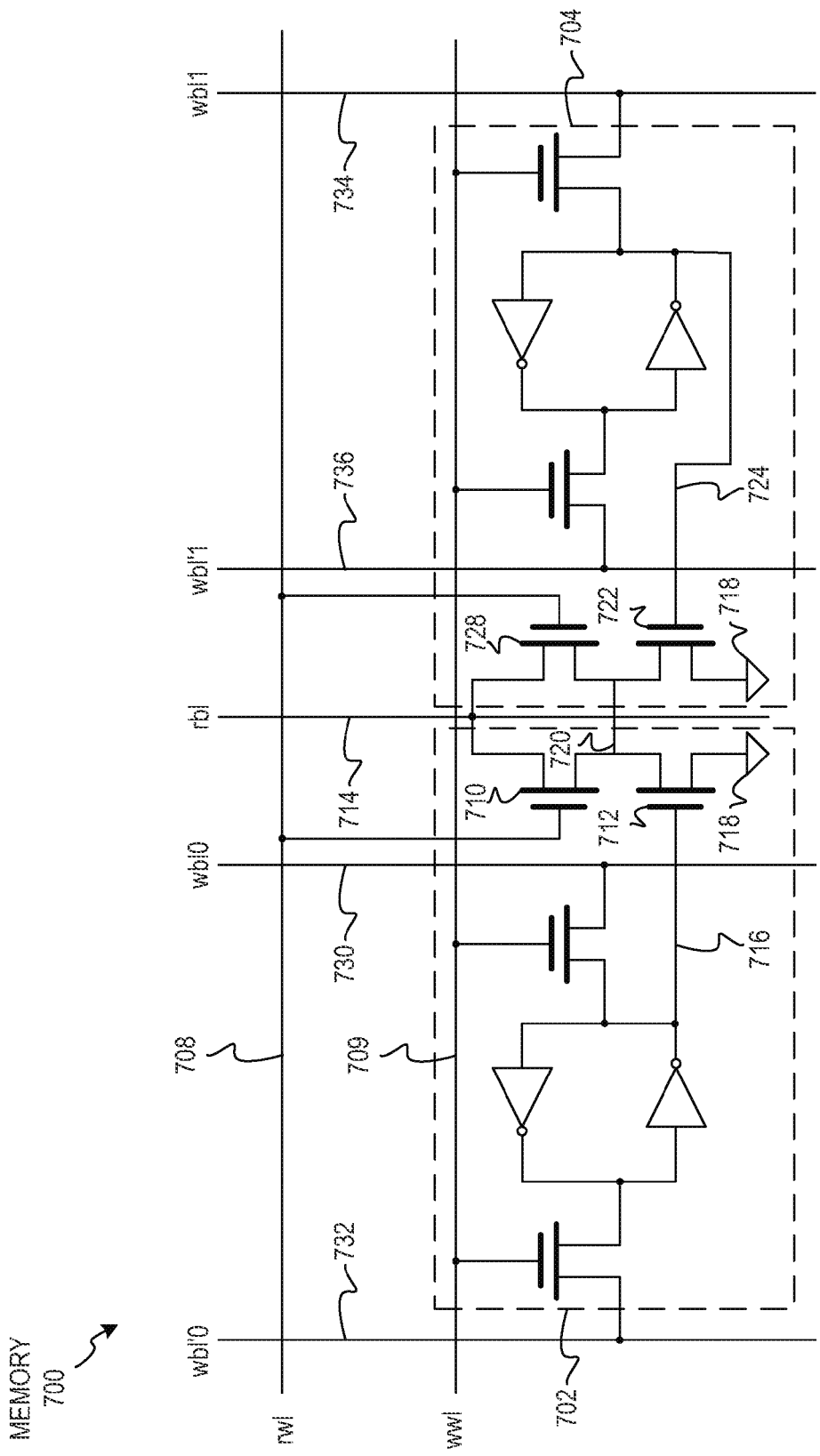
FIG. 7 depicts an example of a memory comprising two physically adjacent memory cells in which a logic function is implemented between bits on the same address in accordance with an illustrative embodiment.

FIG. 7 depicts an example of a memory comprising two physically adjacent memory cells in which a logic function is implemented between bits on the same address in accordance with an illustrative embodiment. Memory cells 702 and 704 are memory cells similar to memory cell 300 of FIG. 3. In this example, memory cell 702 has four transistors that form two cross-coupled inverters and that the inverters are coupled to write bit-line 0 730 and an inverted write bit-line 0 732 via two n-channel pass-transistors, which operate as described previously in FIG. 3. Further, memory cell 704 has four transistors that form two cross-coupled inverters and that the inverters are coupled to write bit-line 1 734 and an inverted write bit-line 1 736 via two n-channel pass-transistors, which operate as described previously in FIG. 3. As is illustrated, the configuration shown in FIG. 7 represents two bits of the same address as is shown by memory cell 702 and 704 being coupled to the same write word line 709.

In accordance with this illustrative embodiment, values stored in the inverters of memory cells may be subject to logic functions, such as ORing, ANDing, NORing, NANDing, or the like. For example, if an OR logic function is to be performed between memory cell 702 and memory cell 704, then a read of memory cells 702 and 704 would cause read word line 708 to be high, which would drive the gate of transistor 710 to pass the value from transistor 712 onto read bit-line 714 as well as drive the gate of transistor 728 to pass the value from transistor 722 onto read bit-line 714.

However, if the value stored in memory cell 702 is a 1 or if the value stored in memory cell 704 is a 1, then the gate of transistor 712 will be high through connection 716, which will cause a discharge to ground 718 and a 0 will be passed onto read bit-line 714, or the gate of transistor 722 will be high through connection 724, which will cause a discharge to ground 718 and a 0 will be passed onto read bit-line 714 all because of connection 720. Therefore, with regard to the logic function performed by the illustrative embodiments, if memory cell 702 or memory cell 704 is storing a 1, then read bit-line 714 would discharge and a 0 would be readout of memory 700. In order for a 1 to be passed onto read bit-line 714, both the value stored in memory cell 702 and the value stored in memory cell 704 would both have to be 0.

Figure 8:
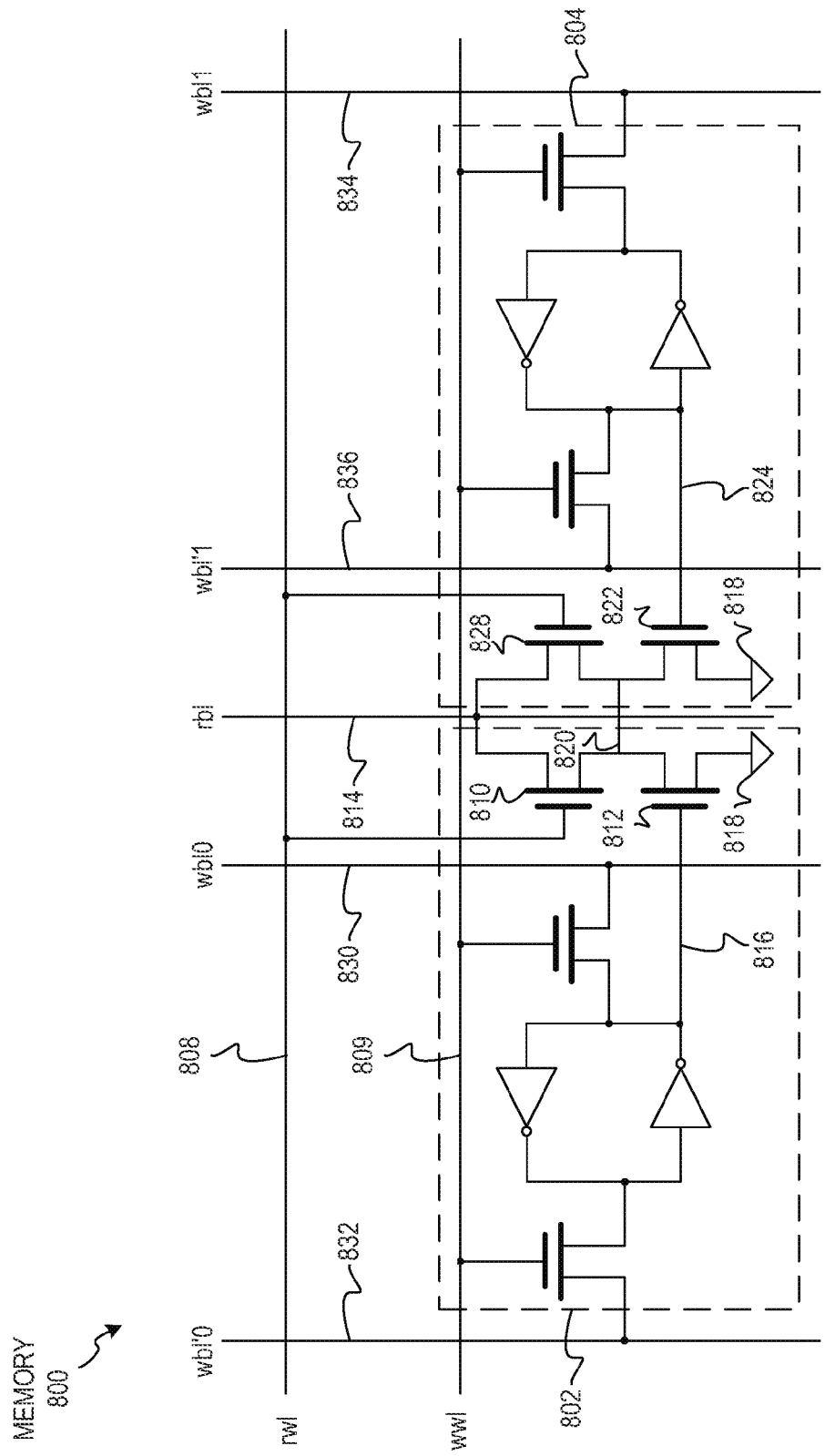
FIG. 8 depicts another example of a memory comprising two physically adjacent memory cells in which a logic function is implemented between bits on the same address in accordance with an illustrative embodiment.

FIG. 8 depicts another example of a memory comprising two physically adjacent memory cells in which a logic function is implemented between bits on the same address in accordance with an illustrative embodiment. Memory cells 802 and 804 are memory cells similar to memory cell 300 of FIG. 3. In this example, memory cell 802 has four transistors that form two cross-coupled inverters and that the inverters are coupled to write bit-line 0 830 and an inverted write bit-line 0 832 via two n-channel pass-transistors, which operate as described previously in FIG. 3. Further, memory cell 804 has four transistors that form two cross-coupled inverters and that the inverters are coupled to write bit-line 1 834 and an inverted write bit-line 1 836 via two n-channel pass-transistors, which operate as described previously in FIG. 3. As is illustrated, the configuration shown in FIG. 8 represents two bits of the same address as is shown by memory cell 802 and 804 being coupled to the same write word line 809.

In accordance with this illustrative embodiment, values stored in the inverters of memory cells may be subject to logic functions, such as ORing, ANDing, NORing, NANDing, or the like. For example, if an OR logic function is to be performed between memory cell 802 and memory cell 804, then a read of memory cells 802 and 804 would cause read word line 808 to be high, which would drive the gate of transistor 810 to pass the value from transistor 812 onto read bit-line 814 as well as drive the gate of transistor 828 to pass the value from transistor 822 onto read bit-line 814.

However, in this example, the value stored in memory cell 802 is being compared to the inverse of the value stored in memory cell 804. That is, if the value stored in memory cell 802 is a 1 or if the value stored in memory cell 804 is a 0, then the gate of transistor 812 will be high through connection 816, which will cause a discharge to ground 818 and a 0 will be passed onto read bit-line 814, or the gate of transistor 822 will be high through connection 824, which will cause a discharge to ground 818 and a 0 will be passed onto read bit-line 814 all because of connection 820. Therefore, with regard to the logic function performed by the illustrative embodiments, if memory cell 802 is storing a 1 "or" memory cell 804 is storing a 0, then read bit-line 814 would discharge and a 0 would be readout of memory 800. In order for a 1 to be passed onto read bit-line 814, both the value stored in memory cell 802 would have to be a 0 and the value stored in memory cell 804 would have to be 1.

Thus, the illustrative embodiments provide mechanism for performing logic functions on more than one memory location within a memory. By implementing logic functions within the memory as opposed to outside the memory, less peripheral circuitry may be required as the logic functions are built into the memory, chip complexity may be reduced due to the reduction in required peripherals, and power required by the chip may be reduced by overall optimization. That is, by performing logic functions directly within the memory, the logic functions operate faster than high-speed cache access memories and a memory with logic functions built in may be more compatible with diverse logic functioning systems.

Figure 9:
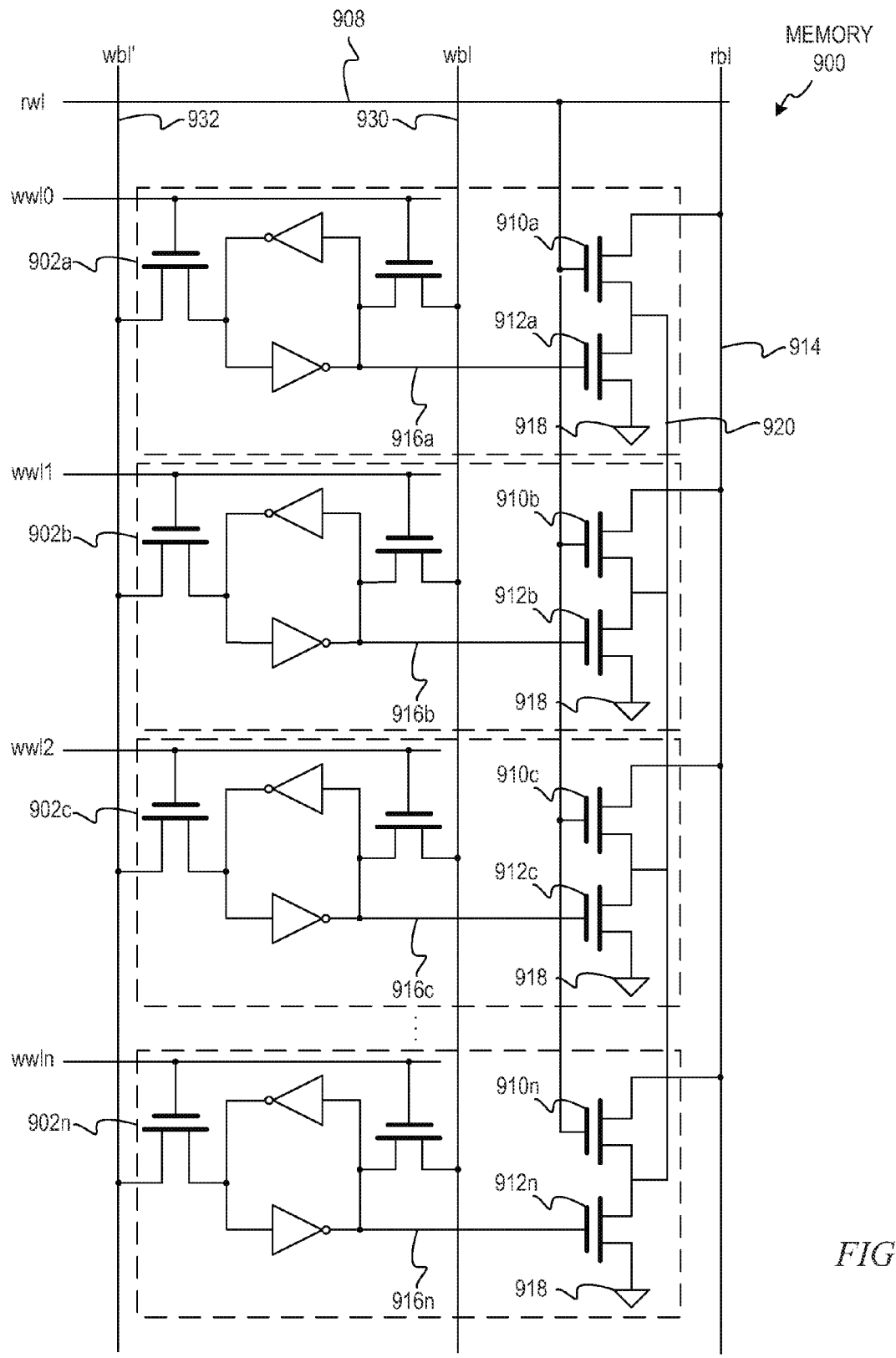
FIG. 9 depicts another example of a memory comprising a number of physically adjacent memory cells with different addresses in which a logic function is implemented in accordance with an illustrative embodiment.

FIG. 9 depicts another example of a memory comprising a number of physically adjacent memory cells with different addresses in which a logic function is implemented in accordance with an illustrative embodiment. Memory cells 902a-902n are memory cells similar to memory cell 300 of FIG. 3. In that memory cells 902a-902n each have four transistors that form two cross-coupled inverters and that the inverters are coupled to write bit-line 930 and an inverted write bit-line 932 via two n-channel pass-transistors, which operate as described previously in FIG. 3. Note that FIG. 9 differs from FIG. 3 in that write bit-line 930 and an inverted write bit-line 932 are on opposite sides, In accordance with this illustrative embodiment, values stored in the inverters of memory cells may be subject to logic functions, such as ORing, ANDing, NORing, NANDing, or the like. For example, if an OR logic function is to be performed between memory cells 902a-902n, then a read of memory cells 902a-902n would cause read word line 908 to be high, which would drive the gates of transistors 910a-910n to pass the value from transistors 912a-912n onto read bit-line 914, However, if the value stored in any of memory cells 902a-902n is a 1, then the gate of transistors 912a, 912b, 912c, or 912n will be high through connections 916a-916n, which will cause a discharge to ground 918 and a 0 will be passed onto read bit-line 914 all because of connection 920. Therefore, with regard to the logic function performed by the illustrative embodiments, if memory cell 902a "or" memory cell 902b "or" memory cell 920c "or" memory cell 902n is storing a 1, then read bit-line 914 would discharge and a 0 would be readout of memory 900. In order for a 1 to be passed onto read bit-line 914, the values stored in each of memory cells 902a-902n would have to be 0.

The benefit of using the configuration illustrated in FIG. 9 is that all front-end of line (FEOL) features are identical to the conventional 8T memory cell. Therefore, no additional front-end device qualification would be required as conventional 8T memory cells could be used with only minor back-end of line modification. As is previously illustrated between FIG. 5 and FIG. 4, an AND logic function can be easily implemented by having connections 916a-916n originate from inverted write bit-line 932 rather than write bit-line 930 or, alternatively, writing the inverse values to memory cells 902a-902n.

Figure 10:
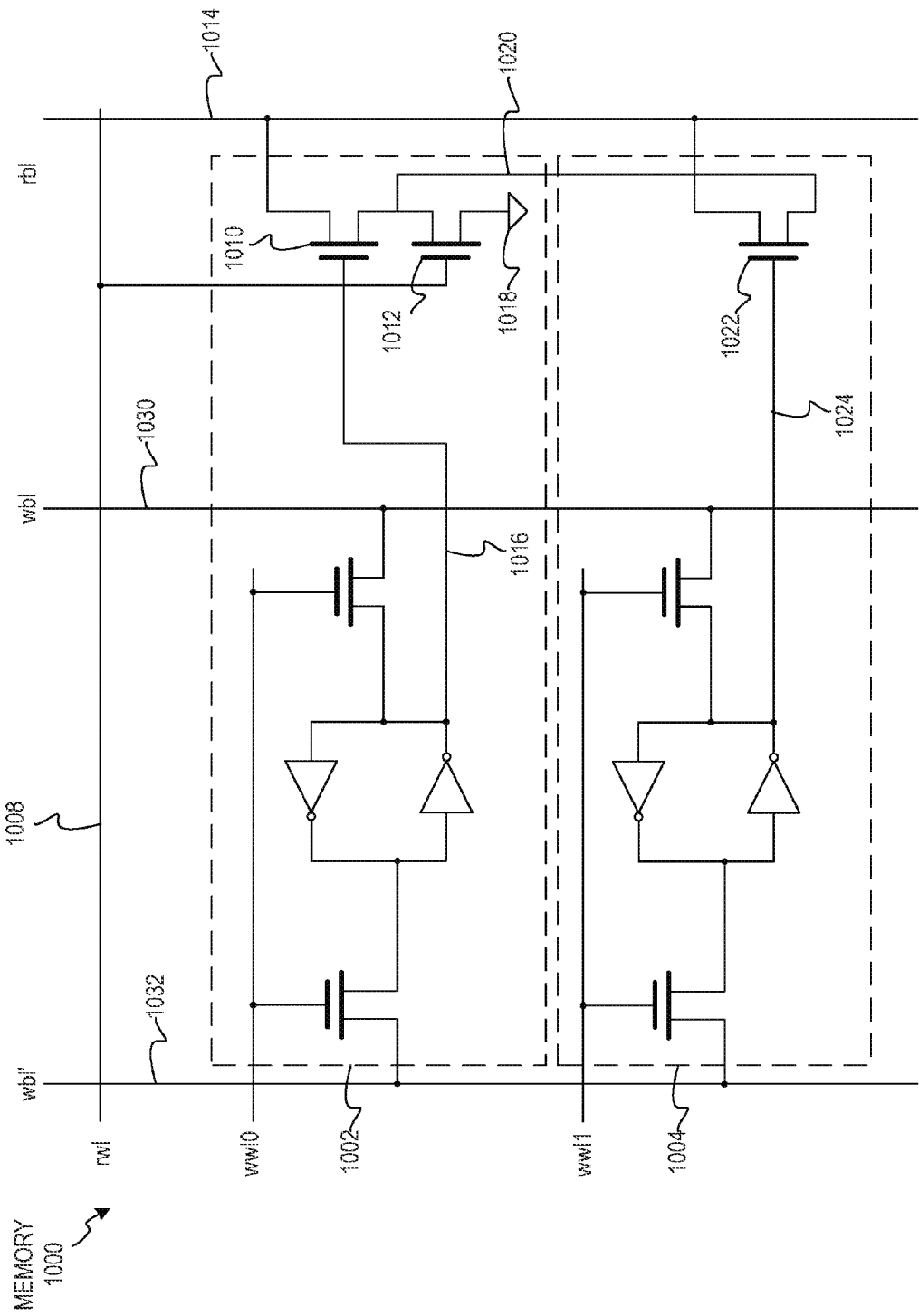
FIG. 10 depicts yet another example of a memory comprising two physically adjacent memory cells with different addresses in which a logic function is implemented in accordance with an illustrative embodiment.

FIG. 10 depicts yet another example of a memory comprising two physically adjacent memory cells with different addresses in which a logic function is implemented in accordance with an illustrative embodiment. Memory cells 1002 and 1004 are memory cells similar to memory cell 300 of FIG. 3. In that memory cells 1002 and 1004 each have four transistors that form two cross-coupled inverters and that the inverters are coupled to write bit-line 1030 and an inverted write bit-line 1032 via two n-channel pass-transistors, which operate as described previously in FIG. 3. Note that FIG. 10 differs from FIG. 3 in that write bit-line 1030 and an inverted write bit-line 1032 are on opposite sides and memory cell 1004 comprises only seven transistors.

In accordance with this illustrative embodiment, values stored in the inverters of memory cells may be subject to logic functions, such as ORing, ANDing, NORing, NANDing, or the like. In this illustration, an OR logic function is performed between memory cell 1002 and memory cell 1004. A read of memory cells 1002 and 1004 would cause read word line 1008 to be high, which drives the transistor 1012 to ground 1018. The value read onto read bit line 1014 is then controlled by the value stored in memory cell 1002 and the value stored in memory cell 1004. That is, if the value stored in memory cell 1002 is a 1, then the gate of transistor 1010 will be high through connection 1016, which will cause a discharge to ground 1018 through transistor 1012 and a 0 will be passed onto read bit-line 1014. Likewise, if the value stored in memory cell 1002 is a 1, then the gate of transistor 1022 will be high through connection 1024, which will cause a discharge to ground 1018 through transistor 1012 and a 0 will be passed onto read bit-line 1014.

However, if the value stored in memory cell 1002 is a 0 and the value stored in memory cell 1004 is a 0, then the gate of transistor 1010 will be low through connection 1016 and the gate of transistor 1022 will be low through connection 1024, which will cause a 1 to be passed onto read bit-line 1014. Therefore, with regard to the logic function performed by the illustrative embodiments, if memory cell 1002 "or" memory cell 1004 is storing a 1, then read bit-line 1014 would discharge and a 0 would be readout of memory 1000 all because of connection 1020.

Figure 11:
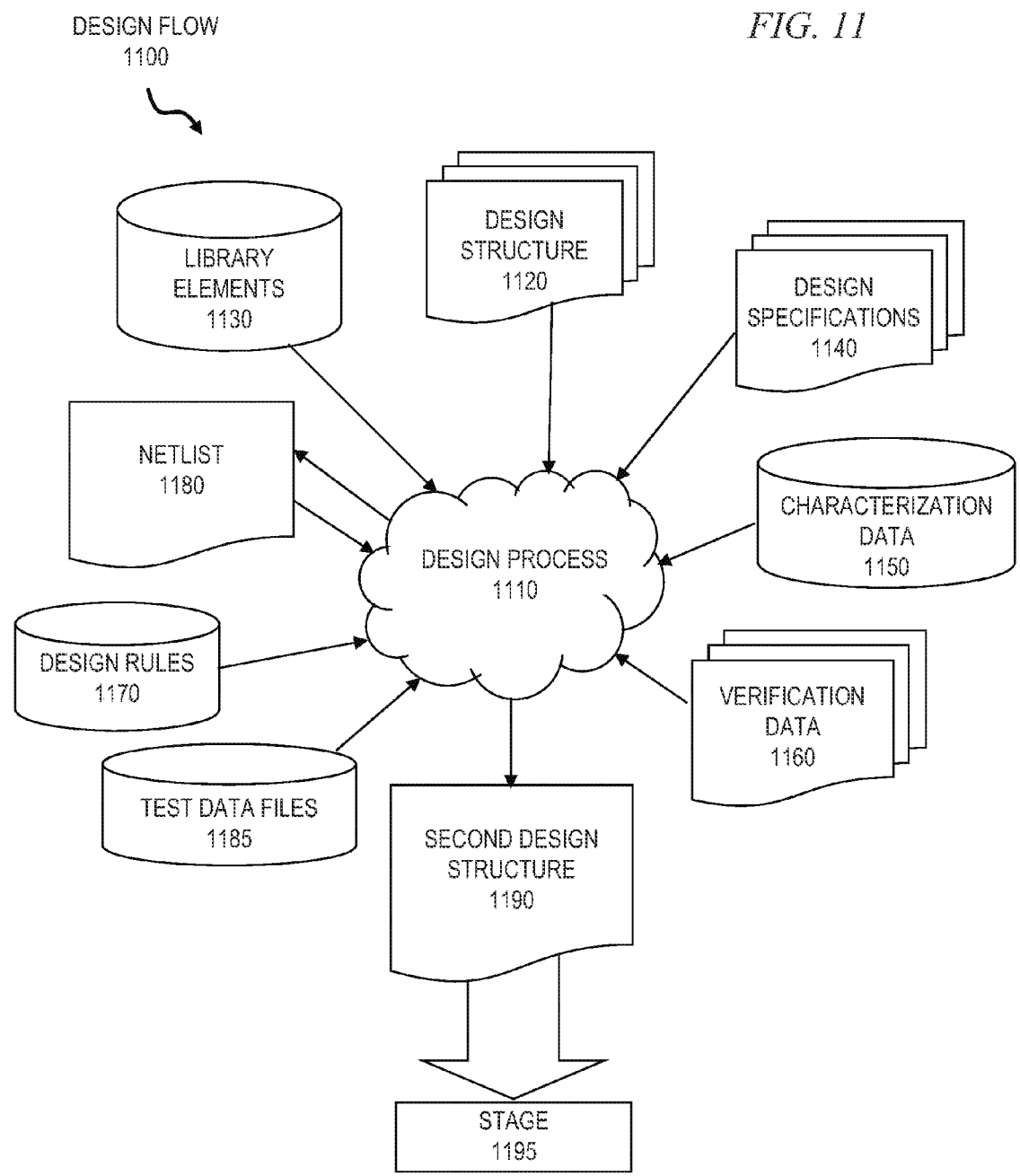
FIG. 11 shows a block diagram of an exemplary design flow used, for example, in semiconductor IC logic design, simulation, test, layout, and manufacture.

FIG. 11 shows a block diagram of an exemplary design flow 1100 used, for example, in semiconductor IC logic design, simulation, test, layout, and manufacture. Design flow 1100 includes processes and mechanisms for processing design structures to generate logically or otherwise functionally equivalent representations of the embodiments of the invention shown in FIGS. 4-8. The design structures processed and/or generated by design flow 1100 may be encoded on machine-readable transmission or storage media to include data and/or instructions that when executed or otherwise processed on a data processing system generate a logically, structurally, or otherwise functionally equivalent representation of hardware components, circuits, devices, or systems.

FIG. 11 illustrates multiple such design structures including an input design structure 1120 that is preferably processed by a design process 1110. Design structure 1120 may be a logical simulation design structure generated and processed by design process 1110 to produce a logically equivalent functional representation of a hardware device. Design structure 1120 may also or alternatively comprise data and/or program instructions that when processed by design process 1110, generate a functional representation of the physical structure of a hardware device. Whether representing functional and/or structural design features, design structure 1120 may be generated using electronic computer-aided design (ECAD) such as implemented by a core developer/designer. When encoded on a machine-readable data transmission or storage medium, design structure 1120 may be accessed and processed by one or more hardware and/or software modules within design process 1110 to simulate or otherwise functionally represent an electronic component, circuit, electronic or logic module, apparatus, device, or system such as those shown in FIGS. 2-10. As such, design structure 1120 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 1110 preferably employs and incorporates hardware and/or software modules for synthesizing, translating, or otherwise processing a design/simulation functional equivalent of the components, circuits, devices, or logic structures shown in FIGS. 2-10 to generate a netlist 1180 which may contain design structures such as design structure 1120. Netlist 1180 may comprise, for example, compiled or otherwise processed data structures representing a list of wires, discrete components, logic gates, control circuits, I/O devices, models, etc. that describes the connections to other elements and circuits in an integrated circuit design. Netlist 1180 may be synthesized using an iterative process in which netlist 1180 is resynthesized one or more times depending on design specifications and parameters for the device. As with other design structure types described herein, netlist 1180 may be recorded on a machine-readable data storage medium. The medium may be a non-volatile storage medium such as a magnetic or optical disk drive, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 1110 may include hardware and software modules for processing u variety of input data structure types including netlist 1180. Such data structure types may reside, for example, within library elements 1130 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 1140, characterization data 1150, verification data 1160, design rules 1170, and test data files 1185 which may include input test patterns, output test results, and other testing information. Design process 1110 may further include modules for performing standard circuit design processes such as timing analysis, verification, design rule checking, place and route operations, etc.

Design process 1110 employs and incorporates well-known logic and physical design tools such as HDL compilers and simulation model build tools to process design structure 1120 together with some or all of the depicted supporting data structures to generate a second design structure 1190. Similar to design structure 1120, design structure 1190 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 2-10. In one embodiment, design structure 1190 may comprise a compiled, executable HDL simulation model that functionally simulates the devices shown in FIGS. 2-10.

Design structure 1190 may also employ a data format used for the exchange of layout data of integrated circuits and/or symbolic data format (e.g. information stored in a GDSII (GDS2), GL1, OASIS, map files, or any other suitable format for storing such design data structures). Design structure 1190 may comprise information such as, for example, symbolic data, map files, test data files, design content files, manufacturing data, layout parameters, wires, levels of metal, vias, shapes, data for routing through the manufacturing line, and any other data processed by semiconductor manufacturing tools to fabricate embodiments of the invention as shown in FIGS. 2-10. Design structure 1190 may then proceed to a stage 1195 where, for example, design structure 1190 proceeds to tape-out, is released to manufacturing, is released to a mask house, is sent to another design house, is sent back to the customer, etc.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A circuit structure for performing a logic function within a memory, comprising:
    a first transistor that receives a read word line signal, wherein, upon receiving the read word line signal, the first transistor provides a path from a second transistor to a read bit-line and a path from a third transistor to the read bit-line;
    the second transistor that, in response to a first memory cell within the memory storing a first value, turns on and provides a first path to ground thereby causing a first output value to be output on the read bit-line;
    the third transistor that, in response to a second memory cell physically adjacent to the first memory cell within the memory storing a second value, turns on and provides a second path to ground thereby causing a second output value to be output on the read bit-line; and
    in response to the first memory cell and the second memory cell each storing a third value, the second transistor and the third transistor both turn off thereby preventing a path to ground such that a third output value is output on the read bit-line.

2. The circuit structure of claim 1, wherein the first value is a write bit-line value from the first memory cell and wherein the second value is a write bit-line value from the second memory cell.

3. The circuit structure of claim 2, wherein the logic function performed is an OR logic function.

4. The circuit structure of claim 1, wherein the first value is an inverted write bit-line value from the first memory cell and wherein the second value is an inverted write bit-line value from the second memory cell.

5. The circuit structure of claim 4, wherein the logic function performed is an AND logic function.

6. A circuit structure for performing a logic function within a memory, comprising:
a first transistor and a second transistor that receive a read word line signal, wherein, upon receiving the read word line signal, the first transistor provides a path from a third transistor to a read bit-line and a path from a fourth transistor to the read bit-line and wherein, upon receiving the read word line signal, the second transistor provides a path from the third transistor to the read bit-line and a path from the fourth transistor to the read bit-line;
the third transistor that, in response to a first memory cell within the memory storing a first value, turns on and provides a first path to ground thereby causing a first output value to be output on the read bit-line;
the fourth transistor that, in response to a second memory cell physically adjacent to the first memory cell within the memory storing a second value, turns on and provides a second path to ground thereby causing a second output value to be output on the read bit-line; and
in response to the first memory cell and the second memory cell each storing a third value, the third transistor and the fourth transistor both turn off thereby preventing a path to ground such that a third output value is output on the read bit-line.

7. The circuit structure of claim 6, wherein the first value is a write bit-line value from the first memory cell and wherein the second value is a write bit-line value from the second memory cell.

8. The circuit structure of claim 7, wherein the logic function performed is an OR logic function.

9. The circuit structure of claim 6, wherein the first value is an inverted write bit-line value from the first memory cell and wherein the second value is an inverted write bit-line value from the second memory cell.

10. The circuit structure of claim 9, wherein the logic function performed is an AND logic function.

11. The circuit structure of claim 6, wherein the first value is a first write bit-line value from the first memory cell and wherein the second value is a different second write bit-line value from the second memory cell.

12. The circuit structure of claim 11, wherein the logic function performed is an OR logic function.

13. The circuit structure of claim 6, wherein the first value is a first write bit-line value from the first memory cell and wherein the second value is an inverted different second write bit-line value from the second memory cell.

14. The circuit structure of claim 13, wherein the logic function performed is an AND logic function.

15. A circuit structure for performing a logic function within a memory, comprising:
a plurality of read word line transistors that receive a read word line signal, wherein, upon receiving the read word line signal, the plurality of read word line transistors provide a path from a plurality of bit-line transistors associated with a plurality of memory cells to a read bit-line;
each of the plurality of read bit-line transistors that, in response to an associated memory cell within the memory storing a first value, turns on and provides a path to ground thereby causing a first output value to be output on the read bit-line, wherein the plurality of memory cells are physically adjacent to each other; and
in response to all of the plurality of memory cells storing a second value, the plurality of read bit-line transistors turn off thereby preventing a path to ground such that a second output value is output on the read bit-line.

16. The circuit structure of claim 15, wherein the first value is a write bit-line value from the plurality of memory cells.

17. The circuit structure of claim 15, wherein the first value is an inverted write bit-line value from the plurality of memory cells.

18. A circuit structure for performing a logic function within a memory, comprising:
a first transistor that receives a read word line signal, wherein, upon receiving the read word line signal, the first transistor provides a path from a second transistor to ground and a path from a third transistor to ground;
the second transistor that, in response to a first memory cell within the memory storing a first value, turns on thereby causing a first output value to be output on the read bit-line;
the third transistor that, in response to a second memory cell physically adjacent to the first memory cell within the memory storing a second value, turns on thereby causing a second output value to be output on the read bit-line; and
in response to the first memory cell and the second memory cell each storing a third value, the second transistor and the third transistor both turn off thereby preventing a path to ground such that a third output value is output on the read bit-line.

19. The circuit structure of claim 18, wherein the first value is a write bit-line value from the first memory cell and wherein the second value is a write bit-line value from the second memory cell.

20. The circuit structure of claim 18, wherein the first value is an inverted write bit-line value from the first memory cell and wherein the second value is an inverted write bit-line value from the second memory cell.

* * * * *